United States Patent
Takanashi et al.

(10) Patent No.: US 9,525,091 B2
(45) Date of Patent: Dec. 20, 2016

(54) PROTECTIVE SHEET FOR SOLAR CELL, MANUFACTURING METHOD THEREOF, AND SOLAR CELL MODULE

(75) Inventors: Yasunari Takanashi, Tokyo (JP); Naoki Taya, Tokyo (JP); Marina Temchenko, Swampscott, MA (US); David William Avison, Townsend, MA (US)

(73) Assignee: LINTEC CORPORATION, Tokyo (JP)

( * ) Notice: Subject to any disclaimer, the term of this patent is extended or adjusted under 35 U.S.C. 154(b) by 737 days.

(21) Appl. No.: 13/880,003

(22) PCT Filed: Oct. 17, 2011

(86) PCT No.: PCT/JP2011/073819
§ 371 (c)(1),
(2), (4) Date: May 10, 2013

(87) PCT Pub. No.: WO2012/053475
PCT Pub. Date: Apr. 26, 2012

(65) Prior Publication Data
US 2013/0327399 A1    Dec. 12, 2013

(30) Foreign Application Priority Data

Oct. 18, 2010   (JP) .................. 2010-234070

(51) Int. Cl.
| | | |
|---|---|---|
| *B32B 27/08* | (2006.01) | |
| *B32B 27/32* | (2006.01) | |
| *H01L 31/18* | (2006.01) | |
| *H01L 31/048* | (2014.01) | |
| *B32B 27/30* | (2006.01) | |
| *H01L 31/049* | (2014.01) | |

(52) U.S. Cl.
CPC ........... *H01L 31/0487* (2013.01); *B32B 27/08* (2013.01); *B32B 27/308* (2013.01); *B32B 27/32* (2013.01); *H01L 31/049* (2014.12); *H01L 31/18* (2013.01); *Y02E 10/50* (2013.01); *Y10T 428/2495* (2015.01); *Y10T 428/24967* (2015.01); *Y10T 428/31913* (2015.04); *Y10T 428/31928* (2015.04)

(58) Field of Classification Search
None
See application file for complete search history.

(56) References Cited

U.S. PATENT DOCUMENTS

| | | |
|---|---|---|
| 2010/0108128 A1 | 5/2010 | Chu et al. |
| 2011/0041891 A1* | 2/2011 | Rummens ............... B32B 15/20 136/244 |
| 2012/0012165 A1 | 1/2012 | Takanashi et al. |

FOREIGN PATENT DOCUMENTS

| | | |
|---|---|---|
| EP | 1249338 A2 | 10/2002 |
| EP | 2555252 A1 | 2/2013 |
| JP | 2004-200322 | 7/2004 |
| JP | 2008-270685 | 11/2008 |

OTHER PUBLICATIONS

European Search Report received in European Patent Application No. 11834314.4, dated Jul. 28, 2016, 7 pages.

* cited by examiner

*Primary Examiner* — Sheeba Ahmed
(74) *Attorney, Agent, or Firm* — Finch & Maloney PLLC

(57) ABSTRACT

Protective sheet 1 for solar cells comprises a base material 11 and a thermoplastic resin layer 12 laminated on at least one surface of the base material 11. The thermoplastic resin layer 12 comprises a first layer 121 laminated on the base material 11 and a second layer 122 laminated on the first layer 121. The first layer 121 contains as the main component a copolymer of ethylene and at least one type selected from the group consisting of (meth)acrylic acid, (meth) acrylic acid ester, glycidyl (meth)acrylate and vinyl acetate. The second layer 122 contains an olefin-based resin as the main component. The protective sheet 1 for solar cells has excellent adhesiveness between the base material and the thermoplastic resin layer and can suppress the warping caused in a solar cell module.

19 Claims, 2 Drawing Sheets

US 9,525,091 B2

PROTECTIVE SHEET FOR SOLAR CELL, MANUFACTURING METHOD THEREOF, AND SOLAR CELL MODULE

TECHNICAL FIELD

The present invention relates to a protective sheet for solar cells to be used as a front surface protective sheet or a back surface protective sheet of a solar cell module and a manufacturing method therefor, and relates also to a solar cell module using the protective sheet for solar cells.

BACKGROUND ART

A solar cell module, which converts the light energy from the sun to electrical energy, attracts attention as a clean energy source capable of generating electricity without emitting carbon dioxide to cope with environmental issues, such as air pollution and global warming.

In general, a solar cell module is configured of: solar cells, comprised of crystal silicon, amorphous silicon or the like, to perform photoelectric conversion; an encapsulant (filling layer), comprised of an electrical insulator, to encapsulate the solar cells; a front surface protective sheet (front sheet) laminated on the front surface of the encapsulant (light receiving surface); and a back surface protective sheet (back sheet) laminated on the back surface of the encapsulant. In order for the solar cell module to have weatherability and durability sustainable for long period of time in outdoor and indoor use, it is required to protect the solar cells and the encapsulant from weather, humidity, fugitive dust, mechanical impact and the like, and avoid the interior of the solar cell module from exposure to the external air thereby to keep hermetically closed state. In this respect, a protective sheet for solar cells is required to have weatherability and durability sustainable for long period use.

Patent Document 1 discloses a back surface protective sheet for solar cells in which an inorganic oxide layer, an adhesive layer and a thermoplastic resin layer are laminated in this order on one surface of a film. This back surface protective sheet for solar cells is applied, via the thermoplastic resin layer, to the encapsulant by being heated and pressed thereon. The film comprises a resin, such as polyethylene terephthalate, on which silicon oxide layer or the like is vacuum-deposited as an inorganic oxide layer. The adhesive layer comprises a maleic acid anhydride modified polyethylene resin while the thermoplastic resin layer comprises polypropylene or the like, and the adhesive layer and the thermoplastic resin layer are laminated on the film with the inorganic oxide layer (a base material) by means of a multilayer co-extrusion lamination method.

PRIOR ART LITERATURE

Patent Document

[Patent Document 1] Published Patent Application No. 2008-270685

SUMMARY OF THE INVENTION

Problems to be Solved by the Invention

However, the back sheet disclosed in Patent Document 1, using as the adhesive layer the maleic acid anhydride modified polyethylene resin, has poor adhesiveness of the adhesive layer to the base material, so that the base material and the thermoplastic resin layer are delaminated from each other to result in a problem that moisture vapor comes into the interior of the solar cell module.

In addition, if the multilayer co-extrusion lamination was performed for the adhesive layer and the thermoplastic resin layer, then contraction would occur in the adhesive layer and/or the thermoplastic resin layer due to cooling after the lamination, leading to a problem that curl occurs in the width direction of rolls or the flow direction. The curl of the back sheet will cause the solar cell module to warp, and not only troubles may occur at the time of installing the solar cell module, but also the solar cell module may possibly be damaged.

The present invention has been created in view of such circumstances, and objects thereof include providing a protective sheet for solar cells that has excellent adhesiveness between the base material and the thermoplastic resin layer and can suppress the warping caused in a solar cell module, providing a manufacturing method therefor, and providing a solar cell module that has excellent adhesiveness between the base material and the thermoplastic resin layer and is suppressed from warping.

Means for Solving the Problems

In order to achieve the above objects, first, the present invention provides a protective sheet for solar cells, comprising a base material and a thermoplastic resin layer laminated on at least one surface of the base material, the thermoplastic resin layer comprising a first layer laminated on the base material and a second layer laminated on the first layer, the first layer containing as a main component a copolymer of ethylene and at least one type selected from the group consisting of (meth)acrylic acid, (meth)acrylic acid ester, glycidyl (meth)acrylate and vinyl acetate, the second layer containing an olefin-based resin as a main component (Invention 1).

According to the above invention (Invention 1), as the first layer of the thermoplastic resin layer has a high adhesion to the base material and the second layer has a high adhesion to an encapsulant of a solar cell module, the protective sheet for solar cells has an advantage that delamination is unlikely to occur. Moreover, because the main component of the first layer is amorphous (non-crystalline) at ordinary temperatures and has elasticity, even if the second layer contracts when cooled from the heated and molten state, the first layer can relax the contraction stress thereby to reduce the curl amount of the protective sheet for solar cells. As a consequence, the solar cell module can be suppressed from warping due to the curl of the protective sheet for solar cells.

In the above invention (Invention 1), it is preferred that the total content of (meth)acrylic acid, (meth)acrylic acid ester, glycidyl (meth)acrylate and vinyl acetate as a monomer unit in the copolymer of the first layer is 3.5 to 15 molar % (Invention 2).

In the above invention (Invention 1, 2), it is preferred that (meth)acrylic acid ester as a monomer unit in the copolymer of the first layer is at least one type selected from the group consisting of methyl acrylate, butyl acrylate, 2-ethylhexyl acrylate and methyl methacrylate (Invention 3).

In the above invention (Invention 1-3), it is preferred that the olefin-based resin of the second layer contains 60 to 100 mass % ethylene as a monomer unit (Invention 4).

In the above invention (Invention 1-4), it is preferred that the olefin-based resin of the second layer has a density of 875 to 920 kg/m³, and a heat of fusion ΔH obtained by a differential scanning calorimeter is 100.0 J/g or less (Invention 5).

In the above invention (Invention 1-5), it is preferred that the thermoplastic resin layer is formed by performing co-extrusion coating of the first layer and the second layer of (Invention 6).

In the above invention (Invention 1-6), it is preferred that the base material has a thickness of 50 to 250 μm, and the thermoplastic resin layer has a thickness of ⅓ to 2 times the thickness of the base material (Invention 7). The thickness of the base material and the thickness of the thermoplastic resin layer satisfying those conditions reduce the curl amount of the protective sheet for solar cells, and the solar cell module can thus be more effectively suppressed from warping due to the curl of the protective sheet for solar cells.

In the above invention (Invention 1-7), it is preferred that the ratio of a thickness of the first layer and a thickness of the second layer is 1:9 to 7:3 (Invention 8).

In the above invention (Invention 1-8), it is preferred that the thermoplastic resin layer is a layer to be caused to adhere to an encapsulant that constitutes a solar cell module (Invention 9).

Second, the present invention provides a manufacturing method for a protective sheet for solar cells, the protective sheet comprising a base material and a thermoplastic resin layer laminated on at least one surface of the base material, the manufacturing method comprising coating, by co-extrusion, a first resin composition and a second resin composition onto at least one surface of the base material so that the first resin composition is located at the base material-side, thereby to form the thermoplastic resin layer comprising a first layer laminated on the base material and a second layer laminated on the first layer, the first layer comprising the first resin composition, the second layer comprising the second resin composition, the first resin composition containing as a main component a copolymer of ethylene and at least one type selected from the group consisting of (meth)acrylic acid, (meth)acrylic acid ester, glycidyl (meth)acrylate and vinyl acetate, the second resin composition containing an olefin-based resin as a main component (Invention 10).

Third, the present invention provides a solar cell module comprising a solar cell, an encapsulant that encapsulates the solar cell, and a protective sheet laminated on the encapsulant, the protective sheet comprising the protective sheet for solar cells (Invention 9), the protective sheet adhering to the encapsulant via the thermoplastic resin layer (Invention 11).

Advantageous Effect of the Invention

The protective sheet for solar cells according to the present invention has excellent adhesiveness between the base material and the thermoplastic resin layer and can suppress the warping caused in the solar cell module because the curl amount is small. Moreover, the manufacturing method for a protective sheet for solar cells according to the present invention allows such a protective sheet for solar cells to be obtained to have excellent advantageous effects as described above. Furthermore, the solar cell module according to the present invention has excellent adhesiveness between the base material and the thermoplastic resin layer and is suppressed from warping due to the curl of the protective sheet.

EMBODIMENTS FOR CARRYING OUT THE INVENTION

Embodiments of the present invention will hereinafter be described.

<<Protective Sheet for Solar Cells>>

Figure 1:
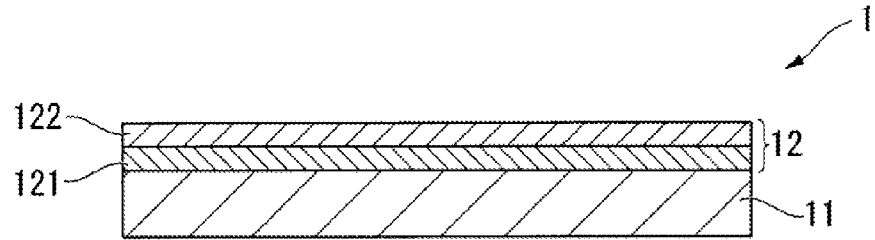
FIG. 1 is a schematic cross-sectional view of a protective sheet for solar cells according to one embodiment of the present invention.

As shown in FIG. 1, protective sheet 1 for solar cells according to the present embodiment comprises a base material 11 and a thermoplastic resin layer 12 laminated on one surface (upper surface in FIG. 1) of the base material 11. This protective sheet 1 for solar cells is to be used as a front surface protective sheet (front sheet) or a back surface protective sheet (back sheet) of a solar cell module.

The base material 11 may be sufficient if having electrical insulation property and capable of being laminated thereon with the thermoplastic resin layer 12, and those mainly comprised of resin films are typically used.

The resin film used for the base material 11 may be selected from resin films to be commonly used in back sheets for solar cell modules. Examples of such a resin film to be used include films or sheets comprised, for example, of polyolefin-based resin such as polyethylene and polypropylene, polyester-based resin such as polyethylene terephthalate (PET) and polyethylene naphthalate, polyamide-based resin such as nylon (trade name), polycarbonate-based resin, polystyrene-based resin such as atactic polystyrene and syndiotactic polystyrene (SPS), polyacrylonitrile-based resin, polyvinyl chloride-based resin, polyvinyl acetal-based resin, polyvinyl butyral-based resin, and fluorine-based resin. Among these resin films, a film comprised of polyester-based resin is preferable, and PET film is particularly preferable.

Note that the above resin film may contain, as necessary, various additives, such as pigment, ultraviolet absorber, ultraviolet stabilizer, flame retardant, plasticizer, antistatic agent, lubricant, and antiblocking agent. Examples of pigment include titanium dioxide, carbon black and other appropriate materials. Examples of ultraviolet absorber include benzophenone-based, benzotriazole-based, oxanilide-based, cyanoacrylate-based, and triazine-based ones.

If the protective sheet 1 for solar cells according to the present embodiment is to be used as a back sheet of a solar cell module, it is preferred that the resin film contains pigment that reflects visible light. If, on the other hand, the protective sheet 1 for solar cells according to the present embodiment is to be used as a front sheet of a solar cell module, the resin film preferably does not contain pigment that reduces transmissivity for visible light and more preferably does contain ultraviolet absorber for the purpose of improving the weatherability.

In order to improve the peel resistance from the thermoplastic resin layer 12, the surface of the resin film to be laminated thereon with the thermoplastic resin layer is preferably subjected to surface treatment, such as corona treatment, plasma treatment and primer treatment.

The thickness of the base material 11 is appropriately set on the basis of the electrical insulation property required for the solar cell module. For example, when the base material 11 is a resin film, it is preferred that the thickness thereof is 10 to 300 µm. In particular, to suppress the curl amount of the protective sheet 1 for solar cells to be small with relation to the thermoplastic resin layer 12 as will be described later and also in view of electrical insulation property and weight saving, the thickness of the base material 11 is preferably 50 to 250 µm, more preferably 60 to 200 µm, and particularly preferably 75 to 150 µm.

The thermoplastic resin layer 12 in the present embodiment is a layer for causing the protective sheet 1 for solar cells to adhere to the encapsulant of the solar cell module, but the present invention is not limited thereto. The thermoplastic resin layer 12 in the present embodiment is configured of a first layer 121 laminated on the base material 11 and a second layer 122 laminated on the first layer 121.

The first layer 121 contains as the main component a copolymer of ethylene and at least one type selected from the group consisting of (meth)acrylic acid, (meth)acrylic acid ester, glycidyl (meth)acrylate and vinyl acetate (the copolymer may hereinafter be referred to as "copolymer F"), while the second layer 122 contains an olefin-based resin as the main component. The first layer 121 comprising the above materials has a large adhesion to the base material 11, particular to the base material 11 comprising a resin film, and further to the base material 11 comprising a PET film. Therefore, the protective sheet 1 for solar cells according to the present embodiment has excellent adhesiveness between the base material 11 and the thermoplastic resin layer 12. On the other hand, the second layer 122 containing an olefin-based resin as the main component has a large adhesion to the encapsulant of the solar cell module due to excellent thermal fusion bonding effect of the olefin-based resin. These large adhesions ensure that the protective sheet 1 for solar cells according to the present embodiment is unlikely to delaminate, and the interior of the solar cell module can thereby be protected for long period of time.

In addition, the copolymer F as the main component of the first layer 121 is amorphous (non-crystalline) at ordinary temperatures and has elasticity. Therefore, even if the second layer 122, which contains an olefin-based resin as the main component, contracts when cooled from the heated and molten state, the first layer 121 can relax the contraction stress. As such, even in the case where co-extrusion coating is performed for the formation of the first layer 121 and the second layer 122 onto the base material 11, stresses are unlikely to be caused to act toward the base material 11, and the curl amount of the protective sheet 1 for solar cells is thus reduced. This can suppress the warping of the solar cell module due to the curl of the protective sheet 1 for solar cells. More specifically, according to the protective sheet 1 for solar cells that comprises the first layer 121 containing the above copolymer F as the main component, the curl amount thereof can be suppressed to 20 mm or less in consideration of a general assumption that, when a square-shaped sample of 300 mm×300 mm is cut out from the protective sheet 1 for solar cells to be placed on a horizontal table, the curl amount of 20 mm or less in the vertical direction ensures that the warping of the solar cell module is suppressed.

The copolymer F as the main component of the first layer 121 is preferably a copolymer of ethylene and (meth)acrylic acid, a copolymer of ethylene and (meth)acrylic acid ester, a copolymer of ethylene and glycidyl (meth)acrylate, a copolymer of ethylene, (meth)acrylic acid and glycidyl (meth)acrylate, a copolymer of ethylene, (meth)acrylic acid and maleic acid anhydride, or a copolymer of ethylene and vinyl acetate, and more preferably a copolymer of ethylene and (meth)acrylic acid ester or a copolymer of ethylene and vinyl acetate. For the first layer 121, one type among these copolymers may be solely used or two or more types may be used in combination. Note that (meth)acrylic acid ester as used herein means both acrylic acid ester and methacrylic acid ester. The same applies to other similar terms.

As the (meth)acrylic acid ester, alkyl (meth)acrylate having from 1 to 18 carbon atoms is preferable, and examples thereof include methyl (meth)acrylate, ethyl (meth)acrylate, propyl (meth)acrylate, butyl (meth)acrylate, and 2-ethylhexyl acrylate. Among them, methyl acrylate, butyl acrylate, 2-ethylhexyl acrylate and methyl methacrylate are preferable, wherein one type may be solely used or two or more types may be used in combination.

Total content of (meth)acrylic acid, (meth)acrylic acid ester, glycidyl (meth)acrylate and vinyl acetate as a monomer unit in the above copolymer F is preferably 3.5 to 15 molar %, and more preferably 4 to 14 molar %. More specifically, the content of (meth)acrylic acid in the copolymer of ethylene and (meth)acrylic acid, the content of (meth)acrylic acid ester in the copolymer of ethylene and (meth)acrylic acid ester, the content of glycidyl (meth)acrylate in the copolymer of ethylene and glycidyl (meth)acrylate, and/or the content of vinyl acetate in the copolymer of ethylene and vinyl acetate, are preferably 3.5 to 15 molar %, and more preferably 4 to 14 molar %.

The total content of (meth)acrylic acid, (meth)acrylic acid ester, glycidyl (meth)acrylate and vinyl acetate is within the above ranges thereby to result in that the previously-described effects of the large adhesion to the base material 11 and the suppression of curl are more significant. Note that, if the total content of (meth)acrylic acid, (meth)acrylic acid ester, glycidyl (meth)acrylate and vinyl acetate is less than 3.5 molar %, then adhesions to the base material 11 and the second layer 122 may be reduced, while on the other hand, if the total content is more than 15 molar %, then sufficient cohesion cannot be obtained and weaving may possibly occur when the protective sheet 1 for solar cells is rolled up.

The first layer 121 may be sufficient if the above copolymer F is contained as the main component, in particular, preferably contained with 60 mass % or more, more preferably with 80 mass % or more, and particularly preferably with 90 mass % or more. Of course, the first layer 121 may consist only of the copolymer F.

The second layer 122 contains an olefin-based resin as the main component. Examples of the olefin-based resin include polyethylene resin such as very low density polyethylene (VLDPE, density: 880 kg/m$^3$ or more and less than 910 kg/m$^3$), low density polyethylene (LDPE, density: 910 kg/m$^3$ or more and less than 915 kg/m$^3$), middle density polyethylene (MDPE, density: 915 kg/m$^3$ or more and less than 942 kg/m$^3$) and high density polyethylene (HDPE, density: 942 kg/m$^3$ or more), polypropylene resin (PP), ethylene-polypropylene copolymer, olefin-based elastomer (TPO), and cycloolefin resin, wherein one type may be solely used or two or more types may be used after being mixed.

Among the above olefin-based resins, polyethylene-based resin is preferable which contains 60 to 100 mass %, particularly 70 to 99.5 mass % ethylene as a monomer unit. Such a polyethylene-based resin has excellent processing suitability, and also has significantly excellent adhesiveness to the encapsulant of the solar cell module, particularly to an encapsulant formed of ethylene-vinyl acetate copolymer which is the same ethylene-based, because of higher affinity therewith. In addition, very low density polyethylene and low density polyethylene are preferable which have lower contraction ratio even when cooled from the heated and molten state, and very low density polyethylene is particularly preferable.

The above olefin-based resin preferably has a density of 875 to 920 kg/m$^3$, and more preferably 880 to 915 kg/m$^3$, while the heat (or enthalpy) of fusion $\Delta H$ obtained by a differential scanning calorimeter is preferably 100.0 J/g or less, and more preferably 95 J/g or less. The density is to be a value obtained by measurement according to JIS K7112.

Olefin-based resin, which has a low or very low density and a low heat of fusion as described above and thus low crystallinity, is with significantly small contraction rate, and hence the protective sheet 1 for solar cells according to the present embodiment has less curl amount.

Note that, if the density of the olefin-based resin is less than 875 kg/m$^3$, then tack may occur in the second layer 122 to cause blockings in the rolled-up protective sheet 1 for solar cells, and blocking traces may occur on the surface of the unrolled protective sheet 1 for solar cells and/or the rolled-up protective sheet 1 for solar cells may not be unrolled.

The second layer 122 may be sufficient if olefin-based resin is contained as the main component, in particular, preferably contained with 60 mass % or more, further preferably with 80 mass % or more, and particularly preferably with 90 mass % or more. Of course, the second layer 122 may consist only of the olefin-based resin.

Melt flow rate (MFR) of the copolymer F in the first layer 121 and the olefin-based resin in the second layer 122 is preferably 1 to 20 g/10 min, and more preferably 2 to 10 g/min. The MFR of both resins is within the above ranges thereby allowing for the first layer 121 and the second layer 122 to be formed by co-extrusion coating.

The first layer 121 and the second layer 122 may contain, as necessary, in addition to the above resin as the main component, various additives, such as pigment, ultraviolet absorber, ultraviolet stabilizer, flame retardant, plasticizer, antistatic agent, lubricant, and antiblocking agent.

The thickness of the thermoplastic resin layer 12 is preferably 1/3 to 2 times the thickness of the base material 11, and more preferably 0.4 to 1.5 times, and particularly preferably 0.6 to 1.2 times. The thermoplastic resin layer 12 comprises the first layer 121 and the second layer 122, which satisfy the above conditions, thereby to further reduce the curl amount of the protective sheet 1 for solar cells, and the solar cell module can thus be more effectively suppressed from warping due to the curl of the protective sheet 1 for solar cells.

Ratio of the thickness of the first layer 121 and the thickness of the second layer 122 is preferably 1:9 to 7:3, more preferably 1.5:8.5 to 6.5:3.5, and particularly preferably 2:8 to 6:4. If the ratio of the thickness of the first layer 121 and the thickness of the second layer 122 is within the above ranges, the curl amount of the protective sheet 1 for solar cells according to the present embodiment is further reduced.

The thickness of the first layer 121 is not particularly limited so long as exerting desired adhesiveness to the base material 11 and stress relaxation without impairing the advantageous effects of the present invention. More specifically, the thickness of the first layer 121 is preferably 5 to 150 µm, more preferably 10 to 100 µm, and particularly preferably 15 to 75 µm.

The thickness of the second layer 122 is not particularly limited so long as exerting desired adhesiveness to the encapsulant without impairing the advantageous effects of the present invention. More specifically, the thickness of the second layer 122 is preferably 10 to 200 µm, more preferably 15 to 150 µm, and particularly preferably 25 to 100 µm.

Note that the thermoplastic resin layer 12 in the present embodiment comprises the first layer 121 and the second layer 122, but the present invention is not limited thereto, and one or more additional layers may be provided so long as not impairing the advantageous effects of the present invention. For example, the first layer 121 and the second layer 122 may be provided with a third layer in between.

Figure 2:
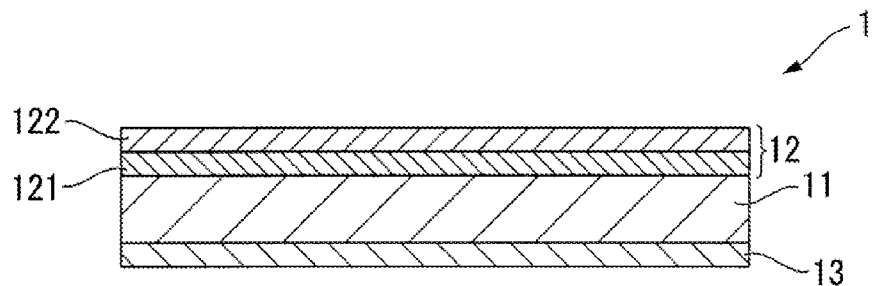
FIG. 2 is a schematic cross-sectional view of a protective sheet for solar cells according to another embodiment of the present invention.

Here, as shown in FIG. 2, it is preferred that a fluorine resin layer 13 is provided on the surface (lower surface in FIG. 2) of the base material 11 at the side where the above thermoplastic resin layer 12 is not laminated. Providing the fluorine resin layer 13 in such a manner improves the weatherability and chemical resistance of the protective sheet 1 for solar cells. Note that, if the base material 11 is formed of a resin film, the surface of the resin film to be laminated thereon with the fluorine resin layer 13 is preferred to be subjected to surface treatment, such as corona treatment, plasma treatment and primer treatment, in order to improve the peel resistance from the fluorine resin layer 13.

The fluorine resin layer 13 is not particularly limited if being a layer that contains fluorine, and is configured of a sheet having fluorine-containing resin (fluorine-containing resin sheet) or a coating obtained by applying a paint that includes fluorine-containing resin. Among them, the coating obtained by applying a paint that includes fluorine-containing resin is preferable in view of reducing the thickness of the fluorine resin layer 13 for the purpose of weight saving of the protective sheet 1 for solar cells.

For example, a resin that contains as the main component polyvinyl fluoride (PVF), ethylene-chlorotrifluoroethylene (ECTFE) or ethylene-tetrafluoroethylene (ETFE) is processed into sheet-like shape to be used as the fluorine-containing resin sheet. Examples of the resin that contains PVF as the main component include "Tedlar" (trade name) available from E. I. du Pont de Nemours and Company. Examples of the resin that contains ECTFE as the main component include "Halar" (trade name) available from Solvay Solexis, Inc. Examples of the resin that contains ETFE as the main component include "Fluon" (trade name) available from ASAHI GLASS CO., LTD.

If the fluorine resin layer 13 is a fluorine-containing resin sheet, the fluorine resin layer 13 is laminated on the base material 11 via an adhesive layer. The adhesive layer is comprised of an adhesive that has adhesiveness to the base material 11 and the fluorine-containing resin sheet. Examples of such an adhesive to be used include acrylic-based adhesive, polyurethane-based adhesive, epoxy-based adhesive, polyester-based adhesive, and polyester polyurethane-based adhesive. One type of these adhesives may be solely used or two or more types may be used in combination.

If, on the other hand, the fluorine resin layer 13 is a coating obtained by applying a paint that includes fluorine-containing resin, then the fluorine resin layer 13 is laminated on the base material 11 by applying the paint, which contains fluorine-containing resin, directly to the base material 11 ordinarily without any adhesive layer.

The paint that contains fluorine-containing resin is not particularly limited if being dissolved into solvent or dispersed into water and capable of being applied.

The fluorine-containing resin to be included in the paint is not particularly limited if being a resin that contains fluorine without impairing the advantageous effects of the present invention, and a resin is ordinarily used which dissolves into solvent of the paint (organic solvent or water) and which is crosslinkable. As the fluorine-containing resin, fluoroolefin resin is preferably used which has a curable functional group. Examples of fluoroolefin resin include a copolymer comprised of tetrafluoroethylene (TFE), isobutylene, vinylidene fluoride (VdF), hydroxybutyl vinyl ether and other monomers, or a copolymer comprised of TFE, VdF, hydroxybutyl vinyl ether and other monomers.

Specific examples of fluoroolefin resin include polymers containing chlorotrifluoroethylene (CTFE) as the main component, such as "LUMIFLON" (trade name) available from ASAHI GLASS CO., LTD, "CEFRAL COAT" (trade name) available from Central Glass Co., Ltd. and "FLUONATE" (trade name) available from DIC Corporation, and polymers containing tetrafluoroethylene (TFE) as the main component, such as "ZEFFLE" (trade name). Among them, in view of weatherability and pigment dispersibility, a polymer that contains CTFE as the main component and a polymer that contains TFE as the main component are preferred, and "LUMIFLON" and "ZEFFLE" are particularly preferred.

"LUMIFLON" is a non-crystalline resin that includes as structural units CTFE and several types of specific alkyl vinyl ether (VE) or hydroxyalkyl vinyl ether. Like this "LUMIFLON", a resin that has a monomer unit of hydroxyalkyl vinyl ether is preferable because of having excellent solvent solubility, cross-linking reactivity, peel resistance from the base material, pigment dispersibility, hardness and flexibility.

"ZEFFLE" is a copolymer of TFE and hydrocarbon olefin that is soluble in organic solvent, and among examples thereof, those including hydrocarbon olefin that comprises a hydroxyl group with high reactivity are preferable because of having excellent solvent solubility, cross-linking reactivity, base material adhesiveness and pigment dispersibility.

Examples of fluorine-containing monomer, which forms the fluorine-containing resin included in the paint, include CTFE, vinyl fluoride (VF), VdF and fluorinated vinyl ether.

Examples of copolymerizable monomer, which forms the fluorine-containing resin included in the paint, include vinylesters of calboxylic acid, such as vinyl acetate, vinyl propionate, butyl butyrate, vinyl isobutyrate, vinyl pivalate, vinyl caproate, vinyl versatate, vinyl laurate, vinyl stearate, cyclohexyl vinyl carbonate and vinyl benzoate, and alkyl vinyl ethers, such as methyl vinyl ether, ethyl vinyl ether, butyl vinyl ether and cyclohexyl vinyl ether.

The paint may include cross-linking agent, curing catalyst, solvent and other appropriate agents in addition to the above-described fluorine-containing resin, and may further include inorganic compounds, such as pigment and filler, if necessary.

Solvent to be included in the paint is not particularly limited so long as not impairing the advantageous effects of the present invention, and solvent is preferably used which includes one or more types of organic solvent selected from methyl ethyl ketone (MEK), cyclohexanone, acetone, methyl isobutyl ketone (MIBK), toluene, xylene, methanol, isopropanol, ethanol, heptane, ethyl acetate, isopropyl acetate, n-butyl acetate, or n-butyl alcohol.

Pigment or filler to be included in the paint is not particularly limited so long as not impairing the advantageous effects of the present invention, and examples to be used include titanium dioxide, carbon black, perylene pigment, mica, polyamide powder, boron nitride, zinc oxide, aluminum oxide, silica, ultraviolet absorber, antiseptic agent, and desiccant agent. Specific examples of the pigment and the filler to be preferably used include "Ti-Pure R105" (trade name) available from E. I. du Pont de Nemours and Company, which is rutile-type titanium dioxide treated with silicon oxide for providing durability, and "CAB-O-SIL TS 720" (trade name) available from Cabot Corporation, which is hydrophobic silica wherein the hydroxyl group on the silica surface is modified by surface treatment using dimethyl silicone.

The coating of the fluorine-containing resin is preferably cured using cross-linking agent in order to improve the weatherability and abrasion-resistance. The cross-linking agent is not particularly limited so long as not impairing the advantageous effects of the present invention, and examples thereof to be preferably used include metal chelate types, silane types, isocyanate types or melamine types. On the assumption that the protective sheet 1 for solar cells will be placed outdoors and used for long period of time, aliphatic isocyanate types of cross-linking agent are preferable in view of weatherability.

Curing catalyst to be included in the paint is not particularly limited so long as not impairing the advantageous effects of the present invention, and examples thereof include dibutyl tin dilaurate for facilitating the cross-linking between the fluorine-containing resin and isocyanate.

The composition of the paint is not particularly limited so long as not impairing the advantageous effects of the present invention, and it is prepared by mixing the fluorine-containing resin, pigment, cross-linking agent, solvent and catalyst, for example. The composition ratio is such that, when the total of the paint is 100 mass %, the content percentage of the fluorine-containing resin is preferably 3 to 80 mass %, and more preferably 25 to 50 mass %, the content percentage of the pigment is preferably 5 to 60 mass %, and more preferably 10 to 30 mass %, and the content percentage of the solvent is preferably 20 to 80 mass %, and more preferably 25 to 65%.

Any known method may be used as the method of applying the paint to the base material 11, and the paint is applied to the base material 11 so that the fluorine resin layer 13 with desired thickness is obtained, for example, using bar coat method, knife coat method, roll coat method, blade coat method, die coat method, gravure coat method, or other appropriate method.

Drying temperature for the paint applied to the base material 11 may be any temperature that does not impair the advantageous effects of the present invention, and the temperature is preferably within a range of 50° C. to 130° C. in view of reducing influence to the base material 11.

The thickness of the fluorine resin layer 13, set with consideration for the weatherability, chemical resistance, weight saving and other factors, is preferably 5 to 50 µm, and more preferably 10 to 30 µm.

Figure 3:
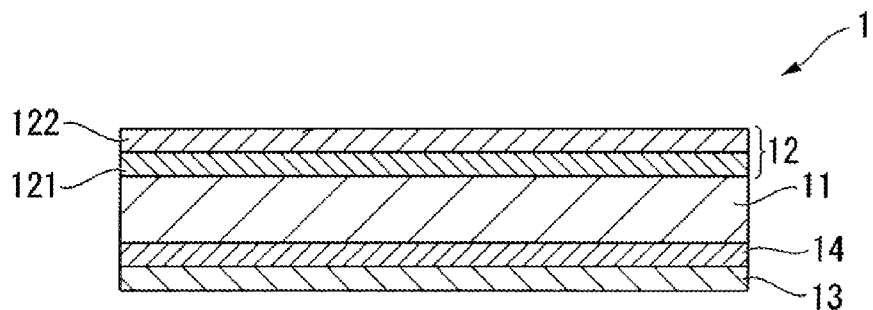
FIG. 3 is a schematic cross-sectional view of a protective sheet for solar cells according to another embodiment of the present invention.

Here, the fluorine resin layer 13 may also be comprised of thermoplastic material, in which case the fluorine resin layer 13 can be formed by extrusion coating method rather than by applying paint. Such a fluorine resin layer 13 may be formed directly on the base material 11 by extrusion coating, or otherwise formed on the base material 11 via one or more additional layers that can enhance the adhesion to the base material 11. For example, as shown in FIG. 3, a second thermoplastic resin layer 14 may be interposed between the fluorine resin layer 13 and the base material 11. In this case, the second thermoplastic resin layer 14 and the fluorine resin layer 13 are preferably coated by co-extrusion on the base material 11.

Examples of the fluorine resin layer 13 comprising thermoplastic material include those that contain as the main component ethylene-tetrafluoroethylene-based copolymer, ethylene-chlorotrifluoroethylene-based copolymer, ethylene-tetrafluoroethylene-hexafluoropropylene-based copolymer, tetrafluoroethylene-perfluoro (alkyl vinyl ether)-based copolymer, tetrafluoroethylene-hexafluoropropylene-based copolymer, tetrafluoroethylene-perfluoro (alkyl vinyl ether)-hexafluoropropylene-based copolymer or other copolymer, or modified polymer thereof. One type of these resins may be solely used or two or more types may be used after being mixed. The fluorine resin layer 13 comprised of thermoplastic material has advantages including weatherability. Among the above resins, ETFE is particularly preferable in view of peel resistance from the base material 11 or from the second thermoplastic resin layer 14.

Examples of material for the second thermoplastic resin layer 14 include polyethylene such as low density polyethylene (LDPE, density: 910 kg/m$^3$ or more and less than 915 kg/m$^3$), middle density polyethylene (MDPE, density: 915 kg/m$^3$ or more and less than 942 kg/m$^3$) and high density polyethylene (HDPE, density: 942 kg/m$^3$ or more), polypropylene (PP), olefin-based elastomer (TPO), cycloolefin-based resin, ethylene-vinyl acetate copolymer (EVA), ethylene-vinyl acetate-maleic anhydride copolymer, ethylene-(meth)acrylic acid copolymer, and ethylene-(meth)acrylic acid ester-maleic anhydride copolymer. Among them, polyolefin based resin such as polyethylene is preferable, and ethylene-glycidyl methacrylate copolymer (EGA) and ethylene-vinyl acetate-maleic anhydride copolymer are more preferable. One type of these resins may be solely used or two or more types may be used after being mixed. The above resins have functional groups and therefore polarity, thus exhibiting large adhesion to the base material 11, particularly to the base material 11 comprising a resin film, and further to the base material 11 comprising a PET film. Among the above resins, EGA is particularly preferable because of excellent adhesiveness both to the fluorine resin layer 13, which comprises fluorine resin that contains a functional group, and to the base material 11 comprising PET etc.

The thickness of the second thermoplastic resin layer 14 is not particularly limited so long as exerting desired adhesiveness to the base material 11 without impairing the advantageous effects of the present invention. More specifically, the thickness of the second thermoplastic resin layer 14 is preferably 2 to 100 µm, more preferably 5 to 75 µm, and particularly preferably 10 to 50 µm.

Figure 4:
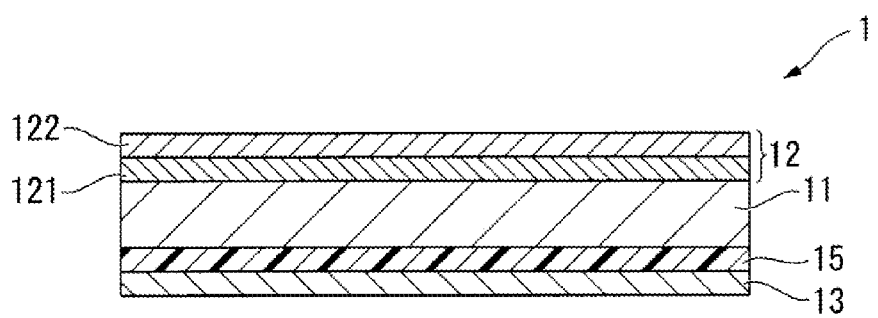
FIG. 4 is a schematic cross-sectional view of a protective sheet for solar cells according to another embodiment of the present invention.
Figure 5:
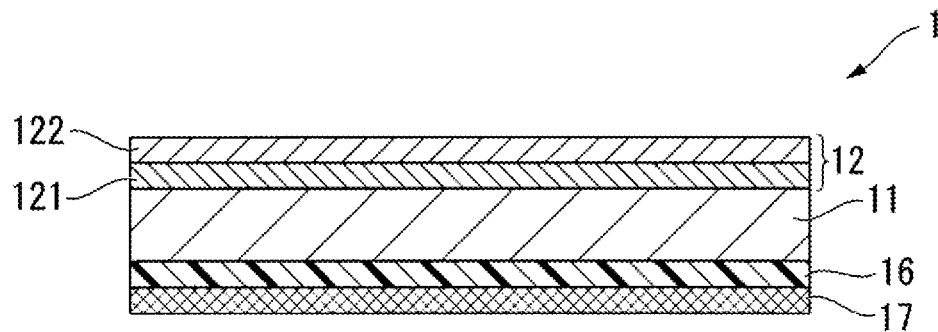
FIG. 5 is a schematic cross-sectional view of a protective sheet for solar cells according to another embodiment of the present invention.

In addition, the surface of the base material 11 at the side where the above thermoplastic resin layer 12 is not laminated may be provided with a vapor-deposited layer 15 between the base material 11 and the fluorine resin layer 13 as shown in FIG. 4, or with a metal sheet 17 via an adhesive layer 16 as shown in FIG. 5, or the above-described fluorine resin layer 13 may also be provided on the surface of the vapor-deposited layer 15 or the metal sheet 17 (each lower surface in FIG. 4 and FIG. 5). Providing the vapor-deposited layer 15 or the metal sheet 17 in such a manner improves the moisture-proof property and the weatherability of the protective sheet 1 for solar cells.

Note that, if the base material 11 is formed of a resin film, the surface of the resin film to be laminated thereon with the vapor-deposited layer 15 or the adhesive layer 16 is preferred to be subjected to surface treatment, such as corona treatment, plasma treatment and primer treatment, in order to improve the peel resistance from the vapor-deposited layer 15 or from the adhesive layer 16.

The vapor-deposited layer 15 is comprised of inorganic material, such as metal or semimetal, oxide of metal or semimetal, nitride, and silicide, thereby allowing for the base material 11 (protective sheet 1 for solar cells) to have the moisture-proof property (water vapor barrier property) and the weatherability.

Examples of vapor deposition method for forming the vapor-deposited layer 15 include chemical vapor phase method such as plasma-enhanced chemical vapor deposition method, thermochemical vapor deposition method and photochemical vapor deposition method, and physical vapor phase method such as vacuum vapor deposition method, sputtering method and ion plating method. Among these methods, sputtering method is preferable in consideration of operability and controllability for the layer thickness.

Examples of metal to be raw material for the vapor-deposited layer 15 include aluminum (Al), magnesium (Mg), calcium (Ca), potassium (K), tin (Sn), sodium (Na), titanium (Ti), lead (Pb), zirconium (Zr), and yttrium (Y). Examples of semimetal include silicon (Si) and boron (B). Examples of oxide, nitride and oxynitride of these metals or semimetals include aluminum oxide, tin oxide, silicon oxide, silicon nitride, silicon oxynitride, and aluminum oxynitride.

The vapor-deposited layer 15 may be comprised of one type of inorganic material or plural types of inorganic materials. The vapor-deposited layer 15 comprised of plural types of inorganic materials may be vapor-deposited layers having a laminated structure in which each layer of inorganic material is sequentially vapor deposited, or a vapor-deposited layer in which the plural types of inorganic materials are concurrently vapor-deposited.

The thickness of the vapor-deposited layer 15 is appropriately set with consideration for the water vapor barrier property and changed depending on the type of inorganic material to be used, vapor deposition density and other factors. Typically, the thickness of the vapor-deposited layer 15 is preferably 5 to 200 nm, and more preferably 10 to 100 nm.

Like the vapor-deposited layer 15, the metal sheet 17 also allows for the base material 11 (protective sheet 1 for solar cells) to have the moisture-proof property (water vapor barrier property) and the weatherability. The material for the metal sheet 17 is not particularly limited so long as having such functions, and examples thereof include aluminum, aluminum alloy such as aluminum-iron alloy, and other appropriate metals.

While the thickness of the metal sheet 17 is not particularly limited so long as not impairing the advantageous effects of the present invention, the thickness is preferably 5 to 100 µm, and more preferably 10 to 50 µm, in view of lower occurrence frequency of pinholes, higher mechanical strength, higher water vapor barrier property, weight saving and other factors.

The adhesive layer 16 is comprised of adhesive that has adhesiveness to the base material 11 and the metal sheet 17. Examples of adhesive to be used for constituting the adhesive layer 16 include acrylic-based adhesive, polyurethane-based adhesive, epoxy-based adhesive, polyester-based adhesive, and polyester polyurethane-based adhesive. One type of these adhesives may be solely used or two or more types may be used in combination.

While the thickness of the adhesive layer 16 is not particularly limited so long as not impairing the advantageous effects of the present invention, typically the thickness is preferably 1 to 20 μm, and more preferably 3 to 10 μm.

Note that the above embodiments exemplify the protective sheet 1 for solar cells in which the thermoplastic resin layer 12 is laminated on one surface of the base material 11, but the protective sheet for solar cells of the present invention is not limited thereto, and a thermoplastic resin layer may also be laminated on the other surface of the base material 11 (opposite surface to the above one surface).

<<Manufacturing Method for Protective Sheet for Solar Cells>>

In order to manufacture the protective sheet 1 for solar cells according to the present embodiment (as one example, the protective sheet 1 for solar cells shown in FIG. 1), it is preferred to coat, by co-extrusion, a first resin composition that constitutes the first layer 121 of the thermoplastic resin layer 12 and a second resin composition that constitutes the second layer 122 onto at least one surface of the base material 11 so that the first resin composition is located at the base material 11-side, thereby to form the thermoplastic resin layer 12 comprising the first layer 121 laminated on the base material 11 and the second layer 122 laminated on the first layer 121. Such a co-extrusion coating method allows the protective sheet 1 for solar cells to be manufactured with high productivity at low cost. Moreover, an additional adhesive layer which causes the protective sheet 1 for solar cells to adhere to the encapsulant of the solar cell module is not required, and time degradation such as due to decomposition of that adhesive can thus be prevented.

More specifically, the protective sheet 1 for solar cells is obtained using a T-die film forming machine or other appropriate machine, which melts and kneads the above respective first resin composition and second resin composition, and coats, by co-extrusion, the molten first resin composition and second resin composition to be laminated on one surface of the base material 11 while causing the base material 11 to move with constant speed, thereby forming the thermoplastic resin layer 12 comprising the first layer 121 and the second layer 122 on the base material 11.

Note that, if one or more additional layers are formed on the base material 11 as shown in FIG. 2 to FIG. 5, the thermoplastic resin layer 12 may be formed on the surface at the side where the one or more additional layers are not formed.

Temperature for melting the first and second resin compositions that form the thermoplastic resin layer 12 is set as being such a temperature that does not deform the base material 11 due to the temperature (heat) of the molten resin compositions, and the temperature is preferably 80° C. to 350° C., more preferably 150° C. to 300° C.

Discharge rates from the T-die film forming machine for the first and second resin compositions that form the thermoplastic resin layer 12 are appropriately adjusted depending on the intended thicknesses of the first layer 121 and the second layer 122 of the thermoplastic resin layer 12 and/or the moving speed of the base material 11.

The base material 11 is caused to move (carried) in the longitudinal direction with constant speed by means of roll-to-roll method, for example, and the moving speed is appropriately adjusted depending on the discharge rates of the first and second resin compositions that form the thermoplastic resin layer 12.

According to the co-extrusion coating method as described above, the thermoplastic resin layer 12 can be tightly bonded to the base material 11 simply by coating the molten first resin composition and second resin composition by the co-extrusion from the T-die film forming machine to be laminated on one surface of the base material 11, and the protective sheet 1 for solar cells can thus be manufactured with high productivity.

<<Solar Cell Module>>

Figure 6:
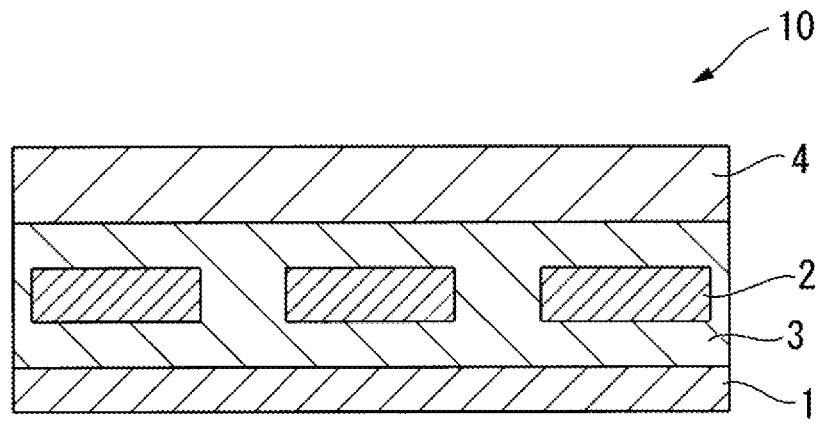
FIG. 6 is a schematic cross-sectional view of a solar cell module according to one embodiment of the present invention.

FIG. 6 is a schematic cross-sectional view of a solar cell module according to one embodiment of the present invention. Solar cell module 10 according to the present embodiment is configured of: plural solar cells 2 as photoelectric conversion elements, each comprising crystal silicon, amorphous silicon and/or other appropriate material; an encapsulant (filling layer) 3, comprising electrical insulator, which encapsulates the solar cells 2; a glass plate 4 laminated on the front surface (upper surface in FIG. 6) of the encapsulant 3; and the protective sheet 1 for solar cells, as a back surface protective sheet (back sheet), laminated on the back surface (lower surface in FIG. 6) of the encapsulant 3.

As understood from the description herein, the protective sheet 1 for solar cells is laminated on the encapsulant 3 so that the second layer 122 of the thermoplastic resin layer 12 is located at the encapsulant 3-side, and hence the thermoplastic resin layer 12 ensures the large adhesion to the encapsulant 3. Moreover, as previously described, the protective sheet 1 for solar cells in the present embodiment has excellent adhesiveness between the base material 11 and the thermoplastic resin layer 12. Due to these large adhesions, the interior of the solar cell module 10 according to the present embodiment is protected by the protective sheet 1 for solar cells for long period of time. Furthermore, the protective sheet 1 for solar cells in the present embodiment exhibits less curl amount, so that the obtained solar cell module 10 is suppressed from warping. Consequently, the solar cell module 10 is prevented from troubles that may occur at the time of installing the solar cell module 10, and/or from being damaged, due to the warpage of the solar cell module 10.

The material for the encapsulant 3 is preferably olefin-based resin, such as that exemplified as the main component of the second layer 122 of the thermoplastic resin layer 12, and more preferably ethylene-vinyl acetate copolymer (EVA) in view of high gas barrier property for oxygen and other problematic gasses, easy cross-linking, and availability. The material for the encapsulant 3 being olefin-based resin ensures the high affinity with the second layer 122, containing olefin-based resin as the main component, of the thermoplastic resin layer 12, thereby further enhancing the adhesion between the thermoplastic resin layer 12 and the encapsulant 3.

Method of manufacturing the above solar cell module 10 is not particularly limited, and the solar cell module 10 can be manufactured, for example, through: sandwiching the solar cells 2 between two sheets that constitute the encapsulant 3; placing the protective sheet 1 for solar cells on one exposed surface of those sheets; placing the glass plate 4 on the other exposed surface of those sheets; integrating them by pressing while heating them in a vacuum state. According to this method, the protective sheet 1 for solar cells is bonded to the encapsulant 3 by the thermal fusion bonding between the thermoplastic resin layer 12 and the encapsulant 3.

Figure 7:
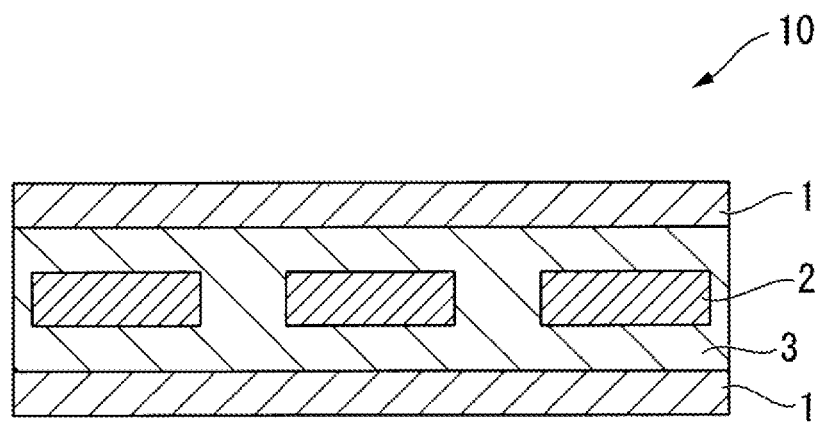
FIG. 7 is a schematic cross-sectional view of a solar cell module according to another embodiment of the present invention.

Note that, as shown in FIG. 7, a protective sheet 1 for solar cells as the front surface protective sheet (front sheet) may be used as a substitute for the glass plate 4. In this case, if flexible substrates are used for the solar cells 2, a solar cell module that has flexibility can be obtained. Causing the solar cell module to have flexibility in such a manner allows for mass production via roll-to-roll process. In addition, as the solar cell module having flexibility can be fitted to an object that has arch-shaped or parabolic-shaped wall surface, the solar cell module can be installed on domed buildings or sound abatement walls of expressway.

It should be appreciated that the embodiments heretofore explained are described to facilitate understanding of the present invention and are not described to limit the present invention. Therefore, it is intended that the elements disclosed in the above embodiments include all design changes and equivalents to fall within the technical scope of the present invention.

EXAMPLES

The present invention will hereinafter be described further specifically with reference to examples etc, but the scope of the present invention is not limited to these examples etc.

Example 1

One surface of a PET film (Lumirror X10S available from Toray Industries, Inc., thickness 125 μm) as a base material was subjected to corona treatment (power output 2,000 W). A protective sheet for solar cells having the structure shown in FIG. 1 was obtained using a T-die film forming machine (cylinder temperature: 230° C. to 280° C., T-die temperature: 300° C.) to coat, by co-extrusion, ethylene-butyl acrylate copolymer (trade name: LOTRYL 17BA07, available from Arkema, content of butyl acrylate: 4.2 molar %, referred hereinafter to as "copolymer A") and low density polyethylene-based resin (trade name: LUMITAC 43-1, available from TOSOH CORPORATION, density 905 kg/m$^3$) to have thicknesses of 25 μm and 75 μm, respectively, directly onto the corona treated surface of the above PET film, the copolymer A being located at the base material-side, thereby forming a thermoplastic resin layer comprising a first layer (the copolymer A) and a second layer (the low density polyethylene-based resin).

Example 2

A protective sheet for solar cells having the structure shown in FIG. 1 was obtained by performing the same operation as Example 1 with the exception of changing the copolymer A to ethylene-butyl acrylate copolymer (trade name: LOTRYL 30BA02, available from Arkema, content of butyl acrylate: 8.6 molar %, referred hereinafter to as "copolymer B").

Example 3

A protective sheet for solar cells having the structure shown in FIG. 1 was obtained by performing the same operation as Example 1 with the exception of changing the copolymer A to ethylene-methyl acrylate copolymer (trade name: LOTRYL 28MA07, available from Arkema, content of methyl acrylate: 11.2 molar %).

Example 4

A protective sheet for solar cells having the structure shown in FIG. 1 was obtained by performing the same operation as Example 1 with the exception of changing the copolymer A to ethylene-methacrylic acid copolymer (NUCREL N1525 available from DUPONT-MITSUI POLYCHEMICALS CO., LTD, content of methacrylic acid: 5.4 molar %).

Example 5

A protective sheet for solar cells having the structure shown in FIG. 1 was obtained by performing the same operation as Example 1 with the exception of changing the copolymer A to ethylene-vinyl acetate copolymer (ULTRATHENE 750 available from TOSOH CORPORATION, content of vinyl acetate: 13.3 molar %).

Example 6

A fluorine coat treated PET film was prepared by using a meyer bar to apply fluorine resin (mixture of LUMIFLON LF-200 available from ASAHI GLASS CO., LTD., Sumidur 3300 available from Sumika Bayer Urethane Co., Ltd. and Ti-Pure R105 available from Du Pont Kabushiki Kaisha, mixed together with a ratio of 100 parts by mass:10 parts by mass:30 parts by mass, respectively) to one surface of a PET film (Tetoron SL available from Teijin DuPont Films Japan Limited, thickness 125 μm) as a base material and drying the fluorine resin at 130° C. during one minute to form a fluorine resin layer having a thickness of 15 μm. Thereafter, non-fluorine coated surface of the obtained fluorine coat treated PET film was subjected to corona treatment (power output 2,000 W).

A T-die film forming machine (cylinder temperature: 230° C. to 280° C., T-die temperature: 300° C.) was used to coat a blended resin of copolymer B and ethylene-butyl acrylate copolymer by co-extrusion (trade name: LOTRYL 35BA40, available from Arkema, content of butyl acrylate: 10.5 molar %, referred hereinafter to as "copolymer C"), blended with mass ratio of 6:4 (copolymer B: copolymer C), and low density polyethylene-based resin (trade name: LUMITAC 43-1, available from TOSOH CORPORATION, density 905 kg/m$^3$), including 15 mass % titanium oxide, to have thicknesses of 25 μm and 75 μm, respectively. In this operation, the co-extrusion coating was performed directly onto the corona treated surface of the above fluorine coat treated PET film so as to place the blended resin of the copolymer B and the copolymer C at the base material-side thereby forming a thermoplastic resin layer comprising a first layer (the blended resin of the copolymer B and the copolymer C) and a second layer (the low density polyethylene-based resin), and a protective sheet for solar cells having the structure shown in FIG. 2 was thus obtained.

Example 7

After a polymerization reactor with stirrer was deaerated, 300.0 g of 1H-tridecafluorohexane, 75.0 g of 1,3-dichloro-1,1,2,2,3-pentafluoropropane (HCFC-225 available from WAKO CHEMICAL, LTD.) and 1.49 g of 3,3,4,4,5,5,6,6,6-nonafluoro-1-hexene were poured into the polymerization reactor. Further, 157.3 g of hexafluoropropan, 49.2 g of tetrafluoroethylene and 1.6 g of ethylene were injected therein, and the temperature of the polymerization reactor was increased to 66° C.

Subsequently, 0.564 g of tert-butyl peroxypivalate was added as polymerization initiator to initiate polymerization. To maintain the pressure constant during the polymerization, mixed tetrafluoroethylene/ethylene monomer gas (mixing ratio: 54/46) was caused to continuously flow into the polymerization reactor. Further, mixed tetrafluoroethylene/ethylene monomer gas (mixing ratio: 54/46), including 1.0 molar % 3,3,4,4,5,5,6,6,6-nonafluoro-1-hexene, 0.25 molar % itaconic acid anhydride and 1 mass % 1,3-dichloro-1,1,2,2,3-pentafluoropropane, was caused to continuously flow therein. Thereafter, at the time of 70 g of the mixed monomer gas fed thereto, the polymerization was stopped and the polymerization reactor was cooled to room temperature while being purged to ordinary pressure. Obtained resin was dried at 120° C. during 24 hours, and the intended fluorine resin (ethylene-tetrafluoroethylene (ETFE) resin; referred to as fluorine resin 1) was obtained.

The obtained fluorine resin 1 was added thereto with pigment master batch for ETFE (H-5100 available from Dainichiseika Color & Chemicals Mfg. Co., Ltd.) so as to have 20 mass % titanium oxide and kneaded, and white colored fluorine resin (referred to as fluorine resin 2) was obtained.

Both surfaces of a PET film (Tetoron SL available from Teijin DuPont Films Japan Limited, thickness 125 μm) were subjected to corona treatment (power output 2,000 W). A T-die film forming machine (cylinder temperature: 200° C., T-die temperature: 300° C.) was then used to coat, by co-extrusion, the fluorine resin 2 obtained as the above and ethylene-glycidyl methacrylate copolymer (trade name: LOTADER AX8840, available from Arkema, content of glycidyl methacrylate: 8.0 molar %) to have each thicknesses of 25 μm directly onto one surface of the above PET film, the ethylene-glycidyl methacrylate copolymer being located at the base material-side, thereby forming a thermoplastic resin layer and a fluorine resin layer.

Further, the co-extrusion coating like Example 2 was performed onto the other surface of the above PET film to form a thermoplastic resin layer comprising a first layer (the copolymer B) and a second layer (the low density polyethylene-based resin), and a protective sheet for solar cells having the structure shown in FIG. 3 was thus obtained.

Example 8

A protective sheet for solar cells having the structure shown in FIG. 1 was obtained by performing the same operation as Example 1 with the exception of changing the copolymer A to ethylene-glycidyl methacrylate copolymer (LOTADER AX8840 available from Arkema, content of glycidyl methacrylate: 8.0 molar %).

Comparative Example 1

A protective sheet for solar cells was obtained by coating low density polyethylene-based resin (trade name: LUMITAC 43-1, available from TOSOH CORPORATION, density 905 kg/m$^3$) by extrusion to have a thicknesses of 75 μm onto the corona treated surface of the PET film obtained like Example 1, thereby forming a thermoplastic resin layer.

<<Exemplary Test 1>> <Adhesiveness Evaluation>

Protective sheets for solar cells obtained in the examples and comparative example were evaluated in terms of adhesiveness according to Japan Industrial Standard: JIS K6854-3: 1999 "Adhesives—Determination of peel strength of bonded assemblies—Part 3: 180 degrees peel test for flexible-to-flexible bonded assemblies (T-peel test)". Specific procedure is as follows.

Each test piece was prepared by cutting the protective sheets for solar cells obtained in the examples and comparative example into 25 mm×200 mm. This test piece was clamped by upper and lower clamps of a universal tensile tester so as to allow for the base material and the thermoplastic resin layer to be peeled off from each other, and the load was measured as an adhesion (initial: N/25 mm) while peeling off one from the other of the test piece with a peeling off speed of 300 mm/min under a given condition, i.e. temperature of 23° C. and humidity of 50% RH (during the test, the base material and the thermoplastic resin layer were clamped to have an opening angle of 180 degrees). Results are shown in Table 1.

In addition, after being subjected to pressure cooker test (121° C., humidity 100% RH, 24 hours), each test piece was measured an adhesion (after durability: N/25 mm) like the above. Results are shown in Table 1.

<<Exemplary Test 2>> <Curl Amount Measurement>

Each test piece was prepared by cutting the protective sheets for solar cells obtained in the examples and comparative example into 300 mm×300 mm square to be placed on a horizontal table, and vertical distances (mm) were measured from the table surface to the curled tops at four corners. Obtained distances at four points were used to calculate an average value representing the curl amount (mm). Results are shown in Table 1.

TABLE 1

| | Adhesion (N/25 mm) | | Curl amount (mm) |
|---|---|---|---|
| | Initial | After durability | |
| Example 1 | >25 | >25 | 21.3 |
| Example 2 | >25 | >25 | 15.3 |
| Example 3 | >25 | >25 | 18.7 |
| Example 4 | >25 | >25 | 20.8 |
| Example 5 | >25 | >25 | 13.6 |
| Example 6 | >25 | >25 | 8.3 |
| Example 7 | >25 | >25 | 14.6 |
| Example 8 | >25 | >25 | 21.0 |
| Comparative Example 1 | 14.8 | 3.1 | 24.1 |

As seen from Table 1, the protective sheets for solar cells of Examples 1 to 8 had large adhesion between the base material (PET film) and the thermoplastic resin layer, and small curl amount.

Example 9

One surface of a PET film (Lumirror X10S available from Toray Industries, Inc., thickness 125 μm) as a base material was subjected to corona treatment (power output 2,000 W). A protective sheet for solar cells having the structure shown in FIG. 1 was obtained using a T-die film forming machine (cylinder temperature: 230° C. to 280° C., T-die temperature: 300° C.) to coat, by co-extrusion, ethylene-butyl acrylate copolymer (trade name: LOTRYL 30BA02, available from Arkema, content of butyl acrylate: 8.6 molar %; copolymer B) and polyethylene-based resin with density of 880 kg/m$^3$ (trade name: EXCELLEN CX4002, available from Sumitomo Chemical Company, Limited) to have thicknesses of 25 μm and 75 μm, respectively, directly onto the corona treated surface of the above PET film, the copolymer B being located at the base material-side, thereby forming a thermoplastic resin layer comprising a first layer (the copolymer B) and a second layer (the polyethylene-based resin with density of 880 kg/m$^3$).

Example 10

A protective sheet for solar cells having the structure shown in FIG. 1 was obtained by performing the same operation as Example 9 with the exception of changing the polyethylene-based resin constituting the second layer to polyethylene-based resin with density of 890 kg/m$^3$ (trade name: Evolue SP900100, available from Prime Polymer Co., Ltd).

Example 11

A protective sheet for solar cells having the structure shown in FIG. 1 was obtained by performing the same operation as Example 9 with the exception of changing the polyethylene-based resin constituting the second layer to polyethylene-based resin with density of 900 kg/m$^3$ (trade name: LUMITAC 22-6, available from TOSOH CORPORATION).

Example 12

A protective sheet for solar cells having the structure shown in FIG. 1 was obtained by performing the same operation as Example 9 with the exception of changing the polyethylene-based resin constituting the second layer to polyethylene-based resin with density of 910 kg/m$^3$ (trade name: LUMITAC 54-1, available from TOSOH CORPORATION).

Example 13

A protective sheet for solar cells having the structure shown in FIG. 1 was obtained by performing the same operation as Example 9 with the exception of changing the polyethylene-based resin constituting the second layer to a blended resin obtained by blending 50 parts by mass of polypropylene resin with density of 890 kg/m$^3$ (trade name: Prime Polypro F-744NP, available from Prime Polymer Co., Ltd) and 50 parts by mass of polyethylene-based resin with density of 905 kg/m$^3$ (trade name: LUMITAC 43-1, available from TOSOH CORPORATION) (density of the blended resin: 898 kg/m$^3$).

Example 14

A protective sheet for solar cells having the structure shown in FIG. 1 was obtained by performing the same operation as Example 10 with the exception of changing the copolymer B constituting the first layer to ethylene-methyl acrylate copolymer (trade name: LOTRYL 28MA07, available from Arkema, content of methyl acrylate: 11.2 molar %).

Example 15

A protective sheet for solar cells having the structure shown in FIG. 1 was obtained by performing the same operation as Example 10 with the exception of changing the copolymer B constituting the first layer to ethylene-methacrylic acid copolymer (NUCREL N1525 available from DUPONT-MITSUI POLYCHEMICALS CO., LTD, content of methacrylic acid: 5.4 molar %).

Example 16

A protective sheet for solar cells having the structure shown in FIG. 1 was obtained by performing the same operation as Example 10 with the exception of changing the copolymer B constituting the first layer to ethylene-vinyl acetate copolymer (ULTRATHENE 750 available from TOSOH CORPORATION, content of vinyl acetate: 13.3 molar %).

Example 17

A protective sheet for solar cells having the structure shown in FIG. 1 was obtained by performing the same operation as Example 10 with the exception of changing the copolymer B constituting the first layer to a blended resin of copolymer B and ethylene-butyl acrylate copolymer (trade name: LOTRYL 35BA40, available from Arkema, content of butyl acrylate: 10.5 molar %; copolymer C), blended with mass ratio of 6:4 (copolymer B: copolymer C).

Example 18

A protective sheet for solar cells having the structure shown in FIG. 1 was obtained by performing the same operation as Example 9 with the exception of changing the polyethylene-based resin constituting the second layer to polyethylene-based resin with density of 910 kg/m$^3$ (trade name: LUMITAC 54-1, available from TOSOH CORPORATION), changing the thickness of the first layer to 10 µm, and changing the thickness of the second layer to 90 µm.

Example 19

A protective sheet for solar cells having the structure shown in FIG. 1 was obtained by performing the same operation as Example 9 with the exception of changing the polyethylene-based resin constituting the second layer to polyethylene-based resin with density of 910 kg/m$^3$ (trade name: LUMITAC 54-1, available from TOSOH CORPORATION), changing the thickness of the first layer to 50 µm, and changing the thickness of the second layer to 50 µm.

Example 20

A protective sheet for solar cells having the structure shown in FIG. 1 was obtained by performing the same operation as Example 9 with the exception of changing the polyethylene-based resin constituting the second layer to polyethylene-based resin with density of 910 kg/m$^3$ (trade name: LUMITAC 54-1, available from TOSOH CORPORATION), changing the thickness of the first layer to 70 µm, and changing the thickness of the second layer to 30 µm.

Example 21

A protective sheet for solar cells having the structure shown in FIG. 1 was obtained by performing the same operation as Example 12 with the exception of changing the PET film as the base material to a PET film with a thickness of 50 µm (Lumirror X10S available from Toray Industries, Inc., thickness 50 µm), changing the thickness of the first layer to 5 µm, and changing the thickness of the second layer to 15 µm.

Example 22

A protective sheet for solar cells having the structure shown in FIG. 1 was obtained by performing the same operation as Example 12 with the exception of changing the PET film as the base material to a PET film with a thickness of 100 μm (Lumirror X10S available from Toray Industries, Inc., thickness 100 μm), changing the thickness of the first layer to 50 μm, and changing the thickness of the second layer to 50 μm.

Example 23

A protective sheet for solar cells having the structure shown in FIG. 1 was obtained by performing the same operation as Example 12 with the exception of changing the PET film as the base material to a PET film with a thickness of 250 μm (Melinex S available from Teijin DuPont Films Japan Limited, thickness 250 μm), changing the thickness of the first layer to 75 μm, and changing the thickness of the second layer to 225 μm.

Example 24

After a polymerization reactor with stirrer was deaerated, 300.0 g of 1H-tridecafluorohexane, 75.0 g of 1,3-dichloro-1,1,2,2,3-pentafluoropropane (HCFC-225 available from WAKO CHEMICAL, LTD.) and 1.49 g of 3,3,4,4,5,5,6,6,6-nonafluoro-1-hexene were poured into the polymerization reactor. Further, 157.3 g of hexafluoropropan, 49.2 g of tetrafluoroethylene and 1.6 g of ethylene were injected therein, and the temperature of the polymerization reactor was increased to 66° C.

Subsequently, 0.564 g of tert-Butyl peroxypivalate was added as polymerization initiator to initiate polymerization. To maintain the pressure constant during the polymerization, mixed tetrafluoroethylene/ethylene monomer gas (mixing ratio: 54/46) was caused to continuously flow into the polymerization reactor. Further, mixed tetrafluoroethylene/ethylene monomer gas (mixing ratio: 54/46), including 1.0 molar % 3,3,4,4,5,5,6,6,6-nonafluoro-1-hexene, 0.25 molar % itaconic acid anhydride and 1 mass % 1,3-dichloro-1,1,2,2,3-pentafluoropropane, was caused to continuously flow therein. Thereafter, at the time of 70 g of the mixed monomer gas fed thereto, the polymerization was stopped and the polymerization reactor was cooled to room temperature while being purged to ordinary pressure. Obtained resin was dried at 120° C. during 24 hours, and the intended fluorine resin (ethylene-tetrafluoroethylene (ETFE); referred to as fluorine resin 1) was obtained.

The obtained fluorine resin 1 was added thereto with pigment master batch for ETFE (H-5100 available from Dainichiseika Color & Chemicals Mfg. Co., Ltd.) so as to have 20 mass % titanium oxide and kneaded, and white colored fluorine resin (referred to as fluorine resin 2) was obtained.

Both surfaces of a PET film (Tetoron SL available from Teijin DuPont Films Japan Limited, thickness 125 μm) were subjected to corona treatment (power output 2,000 W). A T-die film forming machine (cylinder temperature: 200° C., T-die temperature: 300° C.) was then used to coat, by co-extrusion, the fluorine resin 2 obtained as the above and ethylene-glycidyl methacrylate copolymer (trade name: LOTADER AX8840, available from Arkema, content of glycidyl methacrylate: 8.0 molar %) to have each thicknesses of 25 μm directly onto one surface of the above PET film, the ethylene-glycidyl methacrylate copolymer being located at the base material-side, thereby forming a thermoplastic resin layer and a fluorine resin layer.

Further, the co-extrusion coating like Example 9 was performed onto the other surface of the above PET film to form a thermoplastic resin layer comprising a first layer (the ethylene-butyl acrylate copolymer B) and a second layer (the polyethylene-based resin with density of 880 kg/m$^3$), and a protective sheet for solar cells having the structure shown in FIG. 3 was thus obtained.

Example 25

A fluorine coat treated PET film was prepared by using a meyer bar to apply fluorine resin (mixture of LUMIFLON LF-200 available from ASAHI GLASS CO., LTD., Sumidur 3300 available from Sumika Bayer Urethane Co., Ltd. and Ti-Pure R105 available from Du Pont Kabushiki Kaisha, mixed together with a ratio of 100 parts by mass:10 parts by mass:30 parts by mass, respectively) to one surface of a PET film (Tetoron SL available from Teijin DuPont Films Japan Limited, thickness 125 μm) as a base material and drying the fluorine resin at 130° C. during one minute to form a fluorine resin layer having a thickness of 15 μm. Thereafter, non-fluorine coated surface of the obtained fluorine coat treated PET film was subjected to corona treatment (power output 2,000 W).

Like Example 10, the co-extrusion coating was performed onto the corona treated surface of the above PET film thereby forming a thermoplastic resin layer comprising a first layer (the ethylene-butyl acrylate copolymer B) and a second layer (the polyethylene-based resin with density of 890 kg/m$^3$), and a protective sheet for solar cells having the structure shown in FIG. 2 was thus obtained.

Example 26

A protective sheet for solar cells having the structure shown in FIG. 1 was obtained by performing the same operation as Example 10 with the exception of changing the polyethylene-based resin constituting the second layer to a mixture of 100 parts by mass of polyethylene-based resin with density of 890 kg/m$^3$ (trade name: Evolue SP900100, available from Prime Polymer Co., Ltd) and 15 parts by mass of titanium oxide.

Comparative Example 2

One surface of a PET film (Lumirror X10S available from Toray Industries, Inc., thickness 125 μm) as a base material was subjected to corona treatment (power output 2,000 W). A protective sheet for solar cells was obtained using a T-die film forming machine (cylinder temperature: 230° C. to 280° C., T-die temperature: 300° C.) to coat polyethylene-based resin with a density of 918 kg/m$^3$ (trade name: NOVATEC LC615Y, available from Japan Polyethylene Corporation) by extrusion to have a thickness of 100 μm onto the corona treated surface of the above PET film, thereby forming a single-layer thermoplastic resin layer.

Comparative Example 3

One surface of a PET film (Lumirror X10S available from Toray Industries, Inc., thickness 125 μm) as a base material was subjected to corona treatment (power output 2,000 W). A protective sheet for solar cells was obtained using a T-die film forming machine (cylinder temperature: 230° C. to 280° C., T-die temperature: 300° C.) to coat ethylene-butyl acrylate copolymer B (trade name: LOTRYL 30BA02, available from Arkema, content of butyl acrylate: 8.6 molar %) by extrusion to have a thickness of 100 μm onto the corona treated surface of the above PET film, thereby forming a single-layer thermoplastic resin layer.

<<Exemplary Test 3>> <Measurement for Heat of Fusion>

For olefin-based resin constituting each thermoplastic resin layer in Examples 9 to 26 and Comparative Examples 2 and 3, a differential scanning calorimeter (model number: Q2000, available from TA Instruments Japan Inc.) was used to perform measurement of change in heat quantity under the following conditions for sampling data.

—Sample Adjustment Condition

Heating was performed with a rate of temperature rise of 20° C./min from −40° C. to 250° C.

—Measurement Condition

After waiting at 250° C. during 5 minutes, cooling was performed with a rate of temperature fall of 20° C./min to −40° C. while measuring the change in heat quantity.

The obtained data was used to calculate the area of a peak due to solidification, which would represent the heat of fusion ΔH (J/g).

<<Exemplary Test 4>> <Density Measurement>

For olefin-based resin constituting each thermoplastic resin layer in Examples 9 to 26 and Comparative Examples 2 and 3, measurement of density (kg/m$^3$) was performed according to JIS K7112. Note that, in the case of measuring blended resins of two or more types, they were kneaded at 210° C. using a biaxial kneading machine (product name: LABO PLASTOMILL, available from Toyo Seiki Seisaku-sho, Ltd.) and rapidly cooled in water bath thereafter re-processed into pellet form, for which the measurement was performed. Results are shown in Table 2.

<<Exemplary Test 5>> <Blocking Evaluation>

Each protective sheet for solar cells prepared in Examples 9 to 26 and Comparative Examples 2 and 3 was rolled up around a paper core having a diameter of 3 inches and a width of 350 mm with each length of 100 m to prepare a sample for evaluation. This sample for evaluation was stored in an atmosphere of 40° C. during one week, and the condition thereof when unrolled again was evaluated with the criteria below. Results are shown in Table 2.

○: A condition where the sample can be smoothly unrolled.

Δ: A condition where the sample can be unrolled, but blockings partially occur and blocking traces remain on the sheet surface.

x: A condition where blockings partially or entirely occur, and the sample cannot be unrolled.

<<Exemplary Test 6>> <Adhesiveness Evaluation>

Adhesiveness of each protective sheet for solar cells obtained in Examples 9 to 26 and Comparative Examples 2 and 3 was evaluated according to the method described in Exemplary Test 1. Results are shown in Table 2.

<<Exemplary Test 7>> <Curl Amount Measurement>

Curl amount of each protective sheet for solar cells obtained in Examples 9 to 26 and Comparative Examples 2 and 3 was measured and calculated according to the method described in Exemplary Test 2. Results are shown in Table 2.

TABLE 2

| | Heat of fusion ΔH (J/g) | Density (kg/m$^3$) | Adhesion force (N/25 mm) Initial | Adhesion force (N/25 mm) After durability | Curl amount (mm) | Blocking |
|---|---|---|---|---|---|---|
| Example 9 | 50 | 880 | >25 | >25 | 6.3 | ○ |
| Example 10 | 80 | 890 | >25 | >25 | 8.3 | ○ |
| Example 11 | 88 | 900 | >25 | >25 | 13.5 | ○ |
| Example 12 | 95 | 910 | >25 | >25 | 17.3 | ○ |
| Example 13 | 87 | 898 | >25 | >25 | 12.4 | ○ |
| Example 14 | 80 | 890 | >25 | >25 | 11.1 | ○ |
| Example 15 | 80 | 890 | >25 | >25 | 13.9 | ○ |
| Example 16 | 80 | 890 | >25 | >25 | 9.0 | ○ |
| Example 17 | 80 | 890 | >25 | >25 | 7.0 | ○ |
| Example 18 | 95 | 910 | >25 | >25 | 19.7 | ○ |
| Example 19 | 95 | 910 | >25 | >25 | 13.1 | ○ |
| Example 20 | 95 | 910 | >25 | >25 | 10.9 | ○ |
| Example 21 | 95 | 910 | >25 | >25 | 18.8 | ○ |
| Example 22 | 95 | 910 | >25 | >25 | 16.9 | ○ |
| Example 23 | 95 | 910 | >25 | >25 | 14.8 | ○ |
| Example 24 | 50 | 880 | >25 | >25 | 8.3 | ○ |
| Example 25 | 80 | 890 | >25 | >25 | 8.3 | ○ |
| Example 26 | 80 | 890 | >25 | >25 | 8.3 | ○ |
| Comparative Example 2 | 108 | 918 | 9.8 | 4.4 | 36.4 | ○ |
| Comparative Example 3 | — | — | >25 | >25 | 8.8 | x |

As seen from Table 2, the protective sheets for solar cells of Examples 9 to 26 had large adhesion force between the base material (PET film) and the thermoplastic resin layer and small curl amount, and there was no problem of blockings.

INDUSTRIAL APPLICABILITY

The protective sheet for solar cells according to the present invention is preferably utilized as a back sheet of a solar cell module, for example.

EXPLANATION OF NUMERAL REFERENCES

1 . . . Protective sheet for solar cells
11 . . . Base material
12 . . . Thermoplastic resin layer
121 . . . First layer
122 . . . Second layer
13 . . . Fluorine resin layer
14 . . . Second thermoplastic resin layer
15 . . . Vapor-deposited layer
16 . . . Adhesive layer
17 . . . Metal sheet
2 . . . Solar cell
3 . . . Encapsulant
4 . . . Glass plate
10 . . . Solar cell module

The invention claimed is:

1. A protective sheet for solar cells, comprising a base material and a thermoplastic resin layer laminated directly on at least one surface of the base material,
the thermoplastic resin layer comprising a first layer laminated directly on the base material and a second layer laminated directly on the first layer, the first layer containing as a main component a copolymer of ethylene and at least one monomer unit selected from the group consisting of (meth)acrylic acid, (meth)acrylic acid ester, glycidyl (meth)acrylate and vinyl acetate, the second layer containing an olefin-based resin as a main component, wherein the total content of (meth)acrylic acid, (meth) acrylic acid ester, glycidyl (meth)acrylate, and vinyl acetate as a monomer unit in the copolymer of the first layer is 3.5 to 15 molar %.

2. The protective sheet for solar cells as set forth in claim 1, wherein (meth)acrylic acid ester as a monomer unit in the copolymer of the first layer is at least one type selected from the group consisting of methyl acrylate, butyl acrylate, 2-ethylhexyl acrylate and methyl methacrylate.

3. The protective sheet for solar cells as set forth in claim 1, wherein the olefin-based resin of the second layer contains 60 to 100 mass % ethylene as a monomer unit.

4. The protective sheet for solar cells as set forth in claim 1, wherein the olefin-based resin of the second layer has a density of 875 to 920 kg/m$^3$, and a heat of fusion $\Delta H$ obtained by a differential scanning calorimeter is 100.0 J/g or less.

5. The protective sheet for solar cells as set forth in claim 1, wherein the thermoplastic resin layer is a coating comprising a coextruded first layer and second layer.

6. The protective sheet for solar cells as set forth in claim 1, wherein
the base material has a thickness of 50 to 250 µm, and
the thermoplastic resin layer has a thickness of ⅓ to 2 times the thickness of the base material.

7. The protective sheet for solar cells as set forth in claim 1 wherein a ratio of a thickness of the first layer and a thickness of the second layer is 1:9 to 7:3.

8. A solar cell module comprising the protective sheet for solar cells as set forth in claim 1, wherein the solar cell module comprises solar cells that are encapsulated by an encapsulant and the thermoplastic resin layer is adhered to the encapsulant.

9. A manufacturing method for a protective sheet for solar cells, the protective sheet comprising a base material and a thermoplastic resin layer laminated directly on at least one surface of the base material, the manufacturing method comprising:
coating, by co-extrusion, a first resin composition and a second resin composition onto at least one surface of the base material so that the first resin composition is located at a base material-side, thereby forming the thermoplastic resin layer comprising a first layer laminated directly on the base material and a second layer laminated directly on the first layer, the first layer comprising the first resin composition, the second layer comprising the second resin composition, the first resin composition containing as a main component a copolymer of ethylene and at least one monomer unit selected from the group consisting of (meth)acrylic acid, (meth)acrylic acid ester, glycidyl (meth)acrylate and vinyl acetate, the second resin composition containing an olefin-based resin as a main component, wherein the total content of (meth)acrylic acid, (meth) acrylic acid ester, glycidyl (meth)acrylate and vinyl acetate as a monomer unit in the copolymer of the first layer is 3.5 to 15 molar %.

10. A solar cell module comprising a solar cell, an encapsulant that encapsulates the solar cell, and a protective sheet laminated on the encapsulant, wherein the protective sheet is adhered to the encapsulant via the thermoplastic resin layer, and the thermoplastic resin layer comprises a first layer laminated directly on a base material and a second layer laminated directly on the first layer, the first layer containing as a main component a copolymer of ethylene and at least one monomer unit selected from the group consisting of (meth)acrylic acid, (meth)acrylic acid ester, glycidyl (meth)acrylate and vinyl acetate, the second layer containing an olefin-based resin as a main component, wherein the total content of (meth)acrylic acid, (meth) acrylic acid ester, glycidyl (meth)acrylate and vinyl acetate as a monomer unit in the copolymer of the first layer is 3.5 to 15 molar %.

11. The manufacturing method of claim 9, wherein the total content of (meth)acrylic acid, (meth)acrylic acid ester, glycidyl (meth)acrylate and vinyl acetate as a monomer unit in the copolymer of the first layer is 3.5 to 15 molar %.

12. The manufacturing method of claim 9, wherein a ratio of a thickness of the Previously Presented e first layer and a thickness of the second layer is 1:9 to 7:3.

13. The manufacturing method of claim 9, wherein the olefin-based resin of the second layer contains 60 to 100 mass % ethylene as a monomer unit.

14. The manufacturing method of claim 9, wherein the olefin-based resin of the second layer has a density of 875 to 920 kg/m$^3$, and a heat of fusion $\Delta H$ obtained by a differential scanning calorimeter is 100.0 J/g or less.

15. The solar cell module of claim 10, wherein a ratio of a thickness of the first layer and a thickness of the second layer is 1:9 to 7:3.

16. The solar cell module of claim 10, wherein the olefin-based resin of the second layer contains 60 to 100 mass % ethylene as a monomer unit.

17. The solar cell module of claim 10, wherein the olefin-based resin of the second layer has a density of 875 to 920 kg/m$^3$, and a heat of fusion $\Delta H$ obtained by a differential scanning calorimeter is 100.0 J/g or less.

18. The protective sheet of claim 1, wherein the base material is a polyester-based resin film.

19. A solar cell module comprising the protective sheet of claim 1, wherein the the solar cell module comprises solar cells that are encapsulated by an encapsulant and the second layer adheres to the encapsulant.

* * * * *